(12) United States Patent (10) Patent No.: US 8,476,121 B2
Burroughes et al. (45) Date of Patent: Jul. 2, 2013

(54) ORGANIC THIN FILM TRANSISTORS AND METHODS OF MAKING THEM

(75) Inventors: Jeremy Burroughes, Cambridge (GB); Julian Carter, Dry Drayton (GB); Euan Smith, Longstanton (GB); Jonathan Halls, Cambridge (GB); Thomas Kugler, Cambridge (GB); Christopher Newsome, St. Ives (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 56 days.

(21) Appl. No.: 13/056,906

(22) PCT Filed: Aug. 5, 2009

(86) PCT No.: PCT/GB2009/001925
§ 371 (c)(1),
(2), (4) Date: Apr. 22, 2011

(87) PCT Pub. No.: WO2010/015822
PCT Pub. Date: Feb. 11, 2010

(65) Prior Publication Data
US 2011/0186830 A1 Aug. 4, 2011

(30) Foreign Application Priority Data
Aug. 5, 2008 (GB) .................................. 0814305.9

(51) Int. Cl.
*H01L 21/00* (2006.01)
(52) U.S. Cl.
USPC .................... 438/149; 438/99; 257/E21.37
(58) Field of Classification Search
USPC ................... 257/E21.37, E21.374, E21.376, 257/E21.378, E21.4
See application file for complete search history.

(56) References Cited

U.S. PATENT DOCUMENTS

| | | |
|---|---|---|
| 2005/0082523 A1 | 4/2005 | Blanchet-Fincher et al. |
| 2005/0133782 A1 | 6/2005 | Klauk et al. |
| 2006/0068520 A1 | 3/2006 | Song et al. |
| 2006/0160280 A1* | 7/2006 | Suh et al. ...................... 438/149 |
| 2006/0270066 A1 | 11/2006 | Imahayashi et al. |
| 2007/0007515 A1 | 1/2007 | Suh et al. |
| 2007/0082288 A1 | 4/2007 | Wright et al. |
| 2008/0012006 A1 | 1/2008 | Bailey et al. |

(Continued)

FOREIGN PATENT DOCUMENTS
EP 1 681 733 A1 7/2006
GB 2 455 096 A 6/2009
(Continued)

OTHER PUBLICATIONS

Di et al., "High-Performance Low-Cost organic Field-Effect Transistors with Chemically Modified Bottom electrodes," *J. Am. Chem. Soc.*, 128:16418-16419 (2006).

(Continued)

*Primary Examiner* — Cheung Lee
(74) *Attorney, Agent, or Firm* — Marshall, Gerstein & Borun LLP

(57) ABSTRACT

The present invention provides a method of manufacturing an organic thin film transistor (TFT), comprising: providing a substrate layer; providing a gate electrode layer; providing a dielectric material layer; providing an organic semiconductor (OSC) material layer; providing a source and drain electrode layer; and wherein one or more of the layers is deposited using a laser induced thermal imaging (LITI) process. Preferably the organic TFT is a bottom gate device and the source and drain electrodes are deposited on an organic semiconductor layer, or over a dielectric material layer using LITI. Further preferably a dopant material may be provided between the OSC material and the source and drain electrode layer, wherein the dopant material may also be deposited using LITI. Also preferably, wherein the dopant may be a charge neutral dopant such as substituted TCNQ or F4TCNQ.

26 Claims, 6 Drawing Sheets

FOREIGN PATENT DOCUMENTS

WO    WO-2004/087434 A1    10/2004
WO    WO-2008/091285 A2    7/2008

OTHER PUBLICATIONS

Videlot-Ackermann et al., "Charge transfer effects in organic field-effect transistors containing a donor/acceptor heterojunction," *Synthetic Metals, Elsevier Sequoia*, 157:551-557 (2007).

International Preliminary Report on Patentability for Application No. PCT/GB2009/001925, dated Feb. 8, 2011.

International Search Report and Written Opinion for Application No. PCT/GB2009/001925, dated Oct. 23, 2009.

Search Report for Application No. GB0814305.9, dated Dec. 9, 2008.

Examination Report for Application No. GB 0814305.9, dated Mar. 15, 2012.

\* cited by examiner

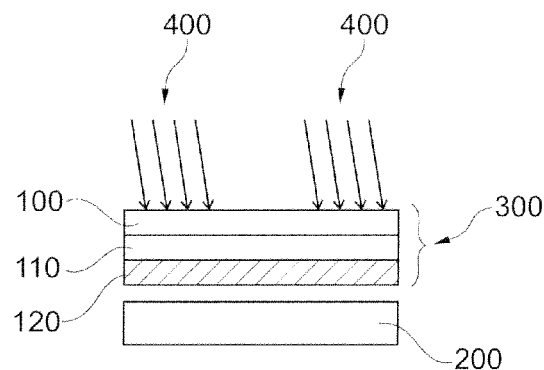
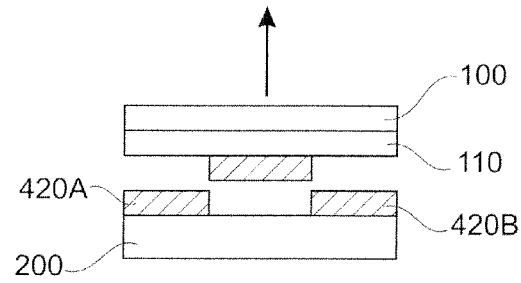
Fig. 6a    Fig. 6b
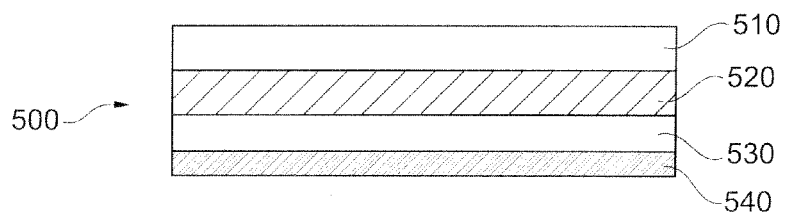
Fig. 7

ORGANIC THIN FILM TRANSISTORS AND METHODS OF MAKING THEM

FIELD OF INVENTION

Aspects of the present invention relate to organic thin film transistors and methods of making them.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as P-type and N-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and injecting holes or electrodes. For example, a P-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO (Highest Occupied Molecular Orbital) level of the semi-conductive material can enhance hole injection and acceptance. In contrast, an N-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO (Lowest Unoccupied Molecular Orbital) level of the semi-conductive material can enhance electron injection and acceptance.

Transistors can be formed by depositing the components in thin films to form thin film transistors. When an organic material is used as the semi-conductive material in such a device, it is known as an organic thin film transistor.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulating material disposed between the gate electrode and the semi-conductive material in the channel region.

An example of such an organic thin film transistor is shown in FIG. 1. The illustrated structure may be deposited on a substrate 1 and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to more clearly show the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. An organic semiconductor (OSC) layer 8 is deposited over the insulating layer 10 of dielectric material. Source and drain electrodes 2, 4 are deposited over the OSC layer 8. The source and drain electrodes 2, 4 are spaced apart with a channel region 6 located therebetween over the gate electrode.

It is also known in the art to provide a thin self-assembled dipole layer on the source and drain electrodes to improve energy level matching. While not being bound by theory, a thin self-assembled dipole layer may provide a field which shifts the energy levels of the OSC near the source/drain electrodes to improve energy level matching between the OSC and the material of the source/drain. This has the effect of reducing the contact resistance at the source and drain electrodes and hence improves the performance of the TFT.

Energy level matching is required to reduce the barrier for hole injection. To do this, the work function of the source and drain materials (contacts) has to be increased, particularly in cases where the metal's work function is too low. This can be done in several ways, two of which are described following.

One way is use materials that form self-assembled monolayers, that is molecules covalently linked to the metal surface that comprise a permanent dipole moment, such as substituted phenyls, thiols or organosilanes.

Another is to use molecules which are strong electron acceptors: where the LUMO level is below the Fermi energy level of the source and drain materials. In this case, when the material is absorbed onto the metal a spontaneous charge transfer from the metal into the LUMO of the acceptor molecule occurs, such that a layer of negatively charged acceptor molecules is formed on the surface of the metal. An example material is fluorine substituted tetracyanoquinodimethane (F4-TCNQ), which is disclosed in the Applicant's earlier application GB-A-0712269.0. US 2005/133782 and *J. Am. Chem. Soc.*, 2006, 128, 16418-16419 also disclose the use of benzo-nitrile or substituted benzo-nitriles such as TCNQ.

Possible surface modifications of the source and drain contacts in order to provide better energy level matching include oxygen plasma treatments, UV-ozone treatments and the formation of self-assembled monolayers comprising molecules with strong permanent dipole moments, as discussed.

FIG. 3 shows a known bottom-gate organic thin film transistor wherein the source and drain electrodes have disposed thereon a thin layer of a doping material. The structure is similar to the prior art arrangement shown in FIG. 2 and for clarity like reference numerals have been used for like parts.

The key difference in the arrangement shown in FIG. 3 is that a thin layer of a doping material 14, for example FTCNQ, or F4TCNQ, is inserted at the interface between the source and drain electrodes 2, 4 and the organic semiconductor 8.

FIG. 4 shows a known top-gate organic thin film transistor wherein the source and drain electrodes have disposed thereon a thin layer of a doping material. The structure is similar to the prior art arrangement shown in FIG. 1 and for clarity like reference numerals have been used for like parts. Again, the key difference in the arrangement shown in FIG. 4 is that the source and drain electrodes 2, 4 have disposed thereon a thin layer of a doping material 14, for example FTCNQ, or F4TCNQ.

The known bottom-gate implementation illustrated in FIG. 3 is usually formed using the method illustrated in FIG. 5 in which schematic cross sections are shown.

1. Gate deposition and patterning 12 (e.g. patterning of an ITO (Indium Tin Oxide) coated substrate).
2. Dielectric deposition and patterning 10 (e.g. cross-linkable, photopatternable dielectrics).
3. Deposition of the OSC 8 (e.g. by ink jet printing of a solution processable polymer).
4. Deposition of dopant layer 16 (eg by shadow masking). The dopant molecules interact with the OSC 8 where they are in contact. For an acceptor dopant with a deep LUMO, electrons are transferred from the OSC to the dopant, rendering a localised region of the OSC conducting. This improves injection and extraction of charges at the source and drain contacts.
5. Source-drain material deposition and patterning 2, 4 (e.g. shadow masking).

This technique is also compatible with top-gate devices. In this case, the source-drain layer is deposited and patterned first (step 5 above). However, with reference to step 4 above, top-gate devices can be treated in many different ways in order to provide better energy-level matching between the source and drain contacts and the OSC, as discussed previously. For example, F4-TCNQ could be applied by spin coating as a self-assembled dipole layer, or it can be evaporated on, or it can be thickly applied using a surface treatment. In these latter two methods, the F4-TCNQ acts as a dopant layer.

Where the source-drain metal needs to be exposed (e.g. for electrical connection to a subsequent conducting layer) any thick dopant layer may need to be removed (e.g. by direct photo-patterning of a photo-reactive attachment group, laser ablation, etc) or prior surface patterning may be required to define where the dopant layer is required. Alternatively, if the F4-TCNQ layer is applied as a thin self-assembled monolayer and is conducting enough, the F4-TCNQ can be left in situ without impeding conducting via formation.

As explained, because the source and drain contacts are deposited before the OSC in top gate devices, a lot can be done to tailor the work function of the source and drain, using the various methods described. As the semiconductor layer is deposited after the fabrication of the source and drain contacts, this allows the modification of the surface of the source and drain contacts prior to the deposition of the semiconducting layer, with the aim to increase the work function of the contacts and thereby to reduce the contact resistance within the TFT devices.

However, in contrast, the fabrication of top contact—bottom gate organic TFTs requires the deposition of metallic source and drain contacts on the top of a pre-formed semiconducting layer.

It is crucial in this case to avoid any contamination of the semiconducting layer, as the presence of redox-active and/or ionic contaminants may increase the TFT OFF current and/or will results in the occurrence of hysteresis effects. Therefore, it has been found that processes that involve chemical reactions such as electroless plating or the thermal/photochemical decomposition of metal precursors are not suitable for fabricating the source and drain contacts on top of an organic semiconducting layer. The same limitations apply to lift-off processes that involve solutions of photo-resists, resist developers and removers. In fact, most of the prior art techniques for the deposition of source and drain electrodes were developed for use with inorganic semiconductors such as silicon (and derivatives thereof) and are extremely damaging when used with organic semiconductor materials.

One technique for a contamination-less deposition of metal patterns uses thermal evaporation through the known technique of "shadow masking". However, the resolution in such shadow mask processes is limited and it is very difficult to control—and improve—the chemical and electronic properties at the interfaces between the evaporated metal contacts and the semiconducting layer.

It has been found that using conventional techniques for applying the source and drain contacts to a bottom gate device leaves little opportunity for doping the bottom of the source and drain contacts adequately or for suitably modifying the profile of the dopant at the source/drain/dopant/OSC interface.

It is an aim of certain embodiments of the present invention to provide an improved method of depositing metallic source and drain contacts on top of an organic semiconducting layer. It is a further aim to provide an improved method of depositing metallic source and drain contacts on top of an organic semiconducting layer whilst ensuring that the resulting interfaces between the metallic contacts and the semiconducting layer are suitably doped and thereby display a low contact resistance. It is a further aim to provide an improved organic thin film transistor.

SUMMARY OF THE INVENTION

The invention comprises applying laser induced thermal imaging processes (LITI) to the deposition of metallic contacts on top of semiconducting layers.

The invention further comprises providing a chemical dopant layer at the interface between the semiconducting layer and the metallic contacts, resulting in a localized chemical interaction and doping of the semiconducting material at the interface to the metallic contacts.

The invention can be applied to the fabrication of organic Thin Film transistors (organic TFTs), allowing for the fabrication of doped, and therefore ohmic, interfaces between source and drain contacts and the semiconducting layer in Top contact—Bottom gate devices, as well as for Top Gate devices.

Therefore in light of the above and in accordance with a first aspect of the present invention there is provided a method of manufacturing an organic thin film transistor (TFT), comprising: providing a substrate layer; providing a gate electrode layer; providing a dielectric material layer; providing an organic semiconductor (OSC) material layer; providing a source and drain electrode layer; and wherein one or more of the layers is deposited using a LITI process.

In accordance with a second aspect of the present invention there is provided a method of manufacturing a top-gate organic thin film transistor (TFT), comprising: providing a substrate layer; depositing a source and/or drain electrode on the substrate layer using a LITI process; providing an organic semiconductor (OSC) material layer over the source and drain electrode layer; and providing a dielectric material layer over the (OSC) material layer; providing a gate electrode on the dielectric material layer.

In accordance with a third aspect of the present invention there is provided a method of manufacturing a bottom-gate organic thin film transistor (TFT), comprising: providing a substrate layer; providing a gate electrode on the substrate layer; providing a dielectric material layer over the gate electrode; providing an organic semiconductor (OSC) material layer over the dielectric material layer; and depositing a source and/or drain electrode on the OSC layer using a LITI process.

In accordance with a fourth aspect of the present invention, there is provided a method of manufacturing a bottom-gate organic thin film transistor (TFT), comprising: providing a substrate layer; providing a gate electrode on the substrate layer; providing a dielectric material layer over the gate electrode; depositing a source and/or drain electrode over the dielectric material layer using a laser induced thermal imaging (LITI) process; and providing an organic semiconductor (OSC) material layer over the source and drain layer.

Preferably and in accordance with the first, second, third and fourth aspects, further providing a dopant material between the OSC material and the source and drain electrode layer. Further preferably wherein the dopant material may also be deposited using LITI.

Also preferably, the dopant may be a charge neutral dopant such as substituted TCNQ or F4TCNQ. It has been found that this derivative is particularly good at doping OSC, binding to source/drain electrodes, and providing a readily wettable surface for the OSC.

Preferably the organic semi-conductive material has a HOMO level which is deeper than the LUMO level of TCNQ. The organic semi-conductive material advantageously has a HOMO level which is shallower than the LUMO of the dopant moiety.

Preferably, the organic semi-conductive material is solution processable in order that the material may be deposited by, for example, inkjet printing or spin-coating. Suitable solution processable materials include polymers, dendrimers and small molecules.

The conductivity of the composition is preferably in the range $10^{-6}$ S/cm to $10^{-2}$ S/cm adjacent the electrodes. However, the conductivity of the compositions can be readily varied by altering the concentration of dopant, or by using a different organic semiconductive material and/or dopant, according to the particular conductivity value desired for a particular use.

For a bottom-gate device an organic dielectric material may be utilized to provide a large differential in the chemical properties of the dielectric layer and the source and drain electrodes such that selective binding of the dopant moiety to the source and drain electrodes is encouraged.

Similarly, for a top-gate device an organic substrate may be utilized to provide a large differential in the chemical properties of the dielectric layer and the source and drain electrodes such that selective binding of the dopant moiety to the source and drain electrodes is encouraged.

In another arrangement, the dielectric layer or the substrate may be treated to enhance the selective binding of the dopant moiety to the source and drain electrodes as opposed to the dielectric layer or the substrate.

Preferably, the source and drain material is one of the following list: silver, a silver colloid, tin, copper, gold, molybdenum, platinum, palladium, tungsten, chromium, or indium tin oxide. A further layer of either molybdenum trioxide or molybdenum oxide is preferably applied to the source and drain contacts.

It is preferable that the source and drain electrode may be heat treated, or sintered at a temperature of less than 150° C., preferably nearer to 100° C. Some silver colloids sinter at 120-130° which materials should therefore be suitable for use as the source and/or drain material. It is also preferable that when using the LITI process that light may be used which is in the infra-red to orange range of wavelengths.

In accordance with a fifth aspect, there is provided an organic thin film transistor (TFT), wherein the TFT is manufactured according to any one of aspects 1 to 3.

In accordance with a sixth aspect, there is provided an Organic Light Emitting Diode (OLED) device, wherein the OLED device includes an organic TFT, wherein the TFT is manufactured according to any one of aspects 1 to 3.

DESCRIPTION OF THE DRAWINGS

The present invention will now be described in detail, by way of example only, with reference to the accompanying drawings in which:

FIGS. 6a and 6b are diagrams showing the deposition of material from a donor substrate to a receptor substrate using LITI, as known in the art;

FIG. 7 is a diagram showing a donor substrate comprising a two-component transfer layer of a conducting material and a dopant material, according to one embodiment of the present invention;

DETAILED DESCRIPTION OF PREFERRED EMBODIMENTS

Figure 1:
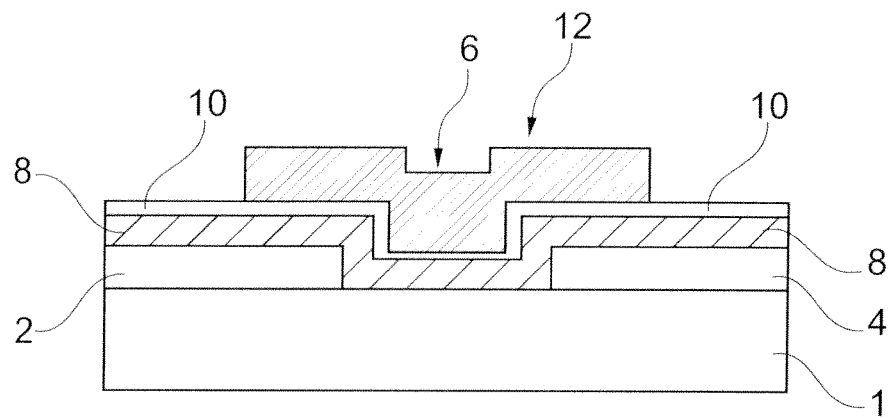
FIG. 1 shows a known top-gate organic thin film transistor arrangement.
Figure 2:
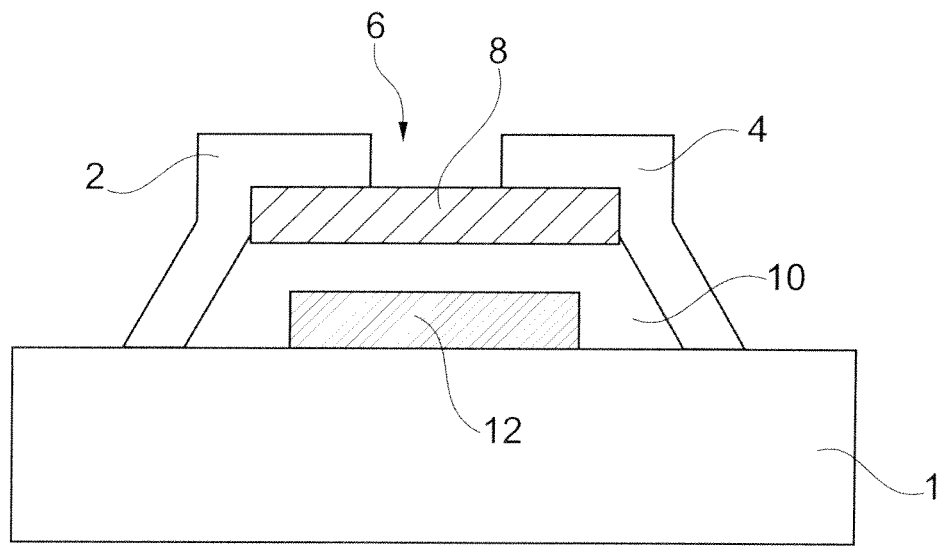
FIG. 2 shows a known bottom-gate organic thin film transistor arrangement.
Figure 3:
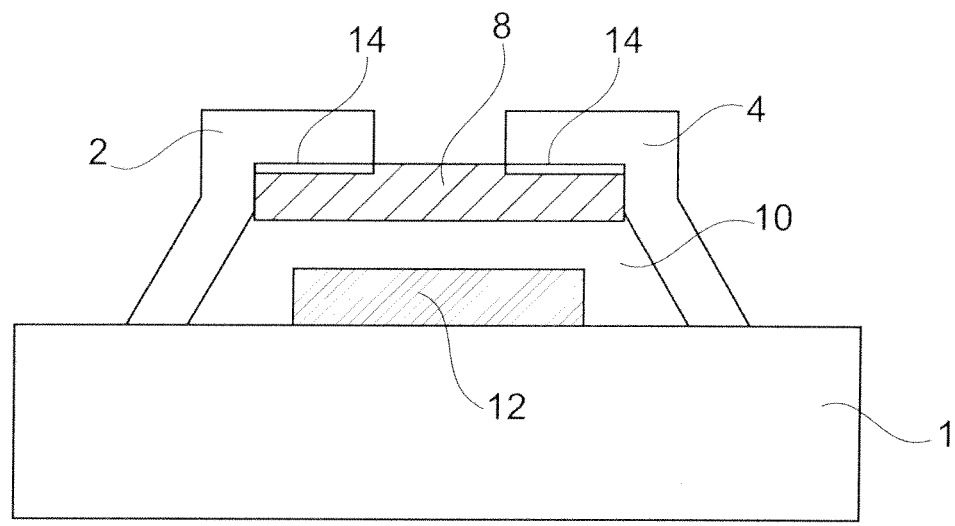
FIG. 3 shows a known bottom-gate organic thin film transistor wherein the source and drain electrodes and the organic semiconductor layer have disposed therein between a thin layer of a doping material.
Figure 4:
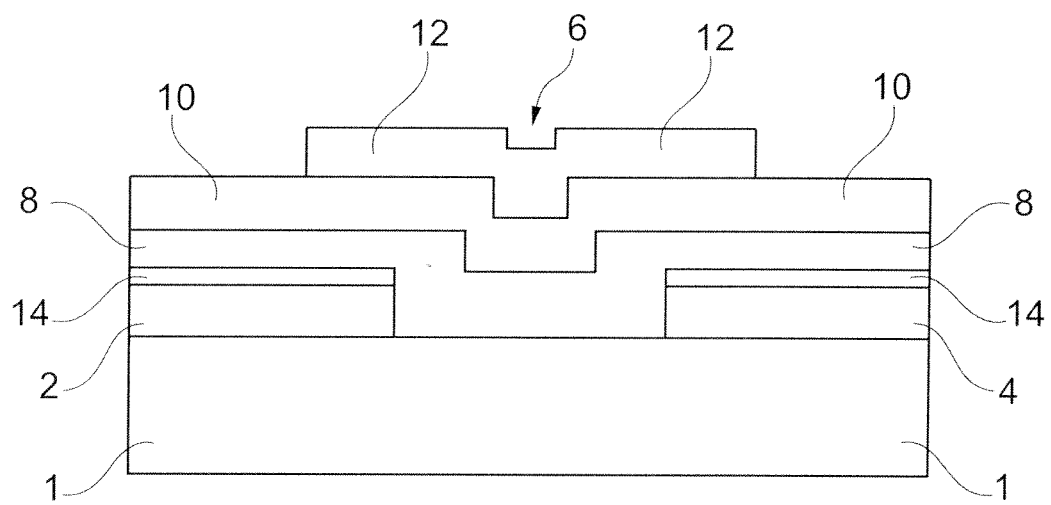
FIG. 4 shows a known top-gate organic thin film transistor wherein the source and drain electrodes have disposed thereon a thin layer of a doping material.
Figure 5:
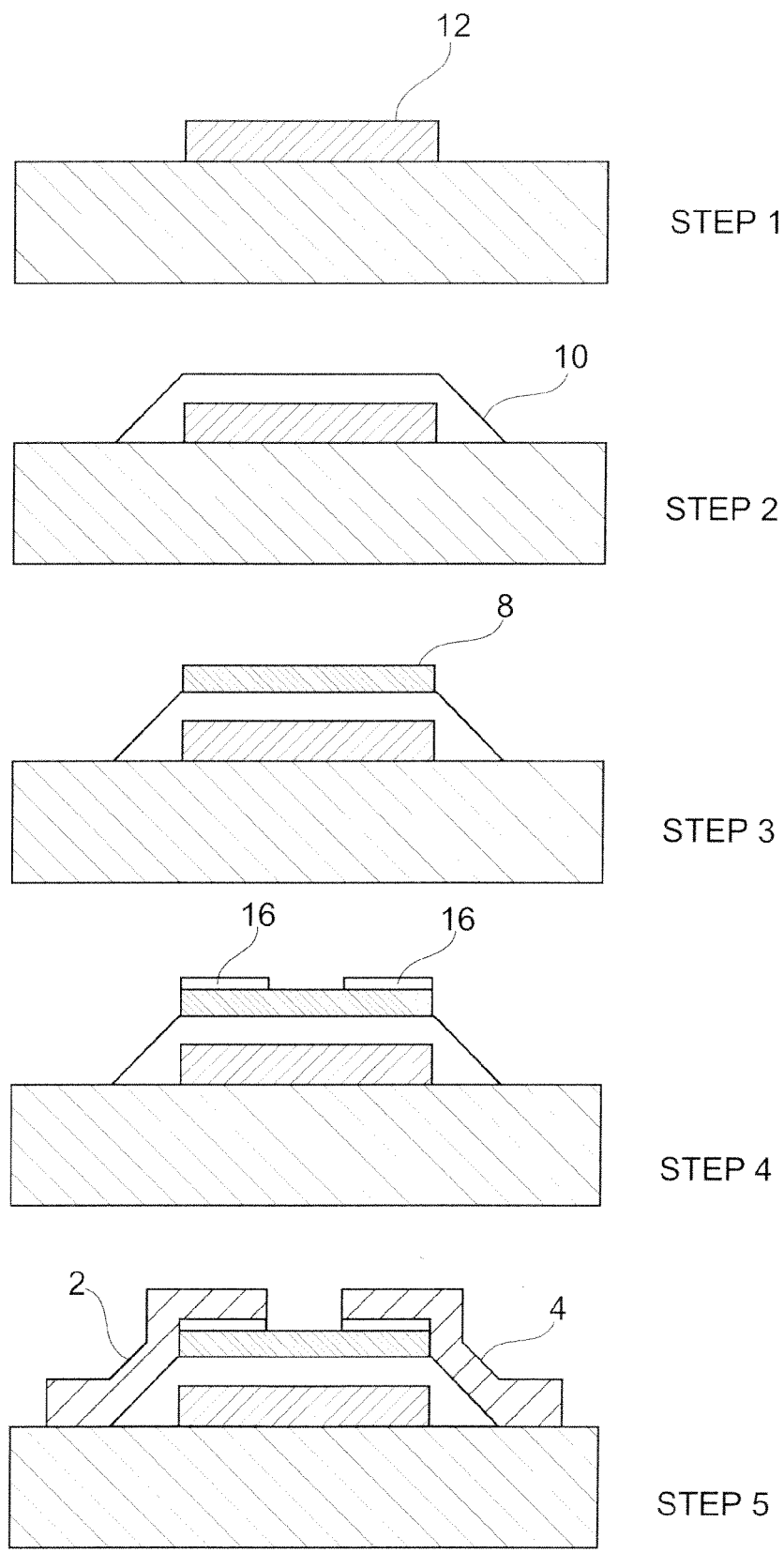
FIG. 5 illustrates known method steps involved in forming an organic thin film transistor according to the embodiment illustrated in FIG. 3.

In general, Laser Induced Thermal Imaging (LITI) allows the transference of patterns of material from a donor substrate to a receptor substrate. FIGS. 6a and 6b are diagrams showing the deposition of material from a donor substrate to a receptor substrate using LITI, as known in the art. There is shown in both FIGS. 6a and 6b a donor substrate 300, which comprises a base substrate 100, a light-to-heat conversion layer 110, and the transfer layer 120 with the material that is to be transferred. During the transfer process, a pre-determined region of the base substrate 100 is irradiated with a laser beam 400, resulting in a conversion of light to heat in the irradiated area (see FIG. 6a). The heat weakens the adhesion between the transfer layer 120 and the light-to-heat conversion layer 110, which results in the transfer layer 120 in the heated areas of the donor substrate 420A and 420B to be transferred to a receptor substrate 200 which is in close contact with the donor substrate 300 (see FIG. 6b).

US Patent Application 2006/0068520 A1 discloses a method of fabricating a donor substrate for laser induced thermal imaging (LITI) processes: a base substrate is prepared. A light-to-heat conversion layer is formed on the base substrate. A buffer layer is formed on the light-to-heat conversion layer. The surface roughness of the buffer layer is increased by treating the surface of the buffer layer. The donor substrate is then completed by forming a transfer layer on the buffer layer. By using the donor substrate, patterns of the material contained in the transfer layer can be deposited on a receptor substrate during the fabrication of OLED displays.

Also, the US patent application 2006/0068520 A1 discloses that in addition to the emissive material in OLEDs, transfer layers comprising hole injection materials, hole transport materials, hole blocking materials, and electron injection materials may be used for pattern deposition using LITI processes during the fabrication of OLEDs.

US Patent Application 2006/0068520 A1 discloses LITI as a method for the patterned deposition of functional materials required for the fabrication of OLED displays.

It is not known to use LITI to deposit one or more layers of an organic thin film transistor.

The objective of one of the embodiments of the present invention is to provide a method of fabricating electronically conducting source and drain contacts on top of the surface of a semiconducting layer, and to further provide a doped interface between these source and drain contacts and the semiconducting layer. This is described with reference to FIGS. 7, 8a and 8b following.

FIG. 7 is a diagram showing a donor substrate comprising a two-component transfer layer of a conducting material and a dopant material, according to one embodiment of the present invention. There is shown in FIG. 7 a donor substrate 500, which comprises a two-component transfer layer (A) with the first (thicker) layer comprising the conducting material (530), and the second (thin top) layer comprising the dopant (540). Also shown is a base substrate 510 and a light-to-heat conversion layer 520.

Figure 8A:
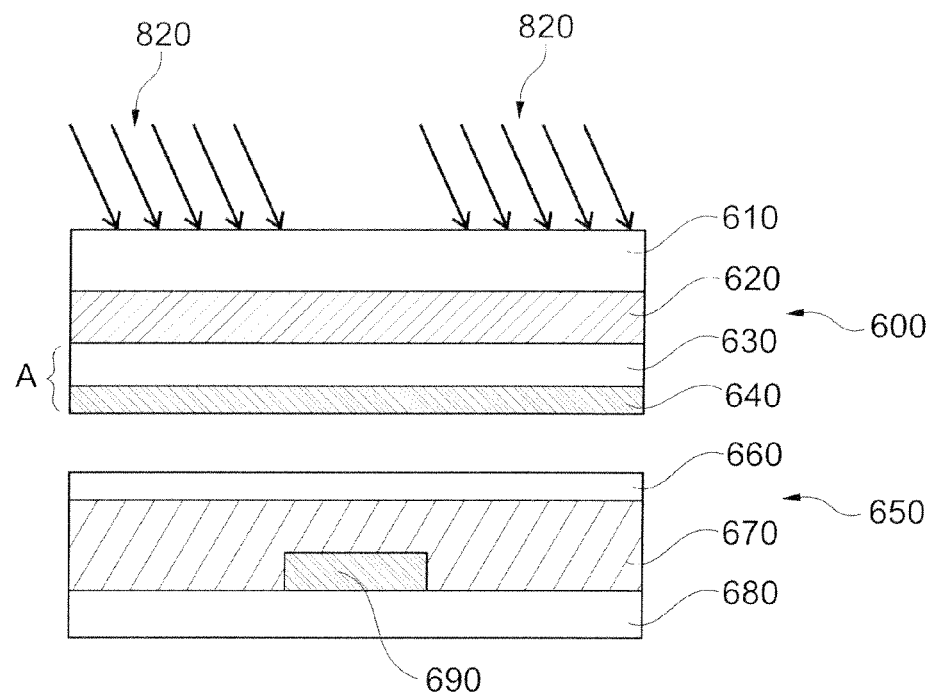
FIGS. 8a and 8b are diagrams showing the transfer of the two component transfer layer comprising a conducting material and dopant material of FIG. 7 to the semiconductor layer of a TFT using a LITI process, according to one embodiment of the present invention.
Figure 8B:
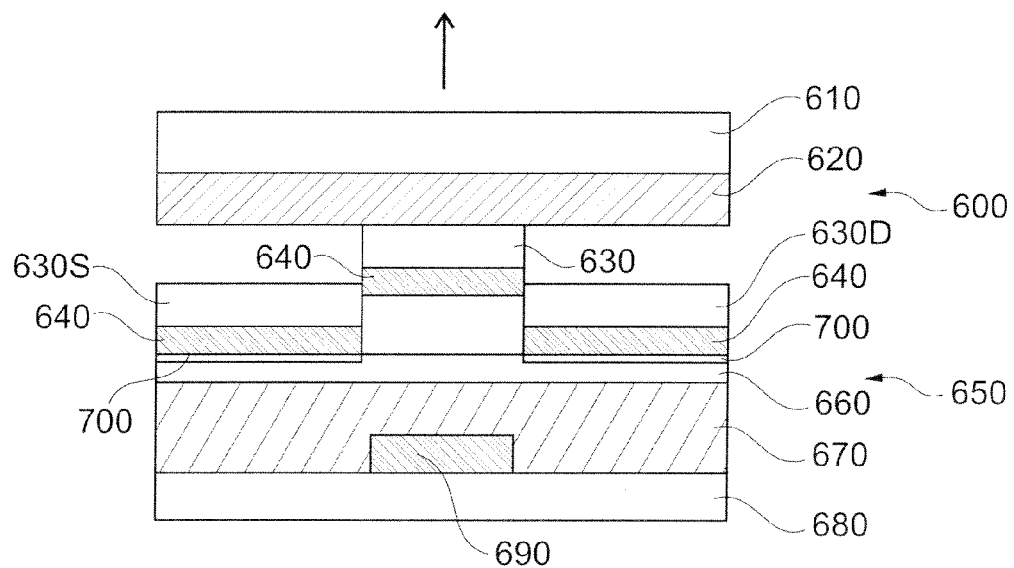

FIGS. 8a and 8b are diagrams showing the transfer of the two component transfer layer comprising a conducting material and dopant material of FIG. 7 to the organic semiconductor layer of a TFT using a LITI process, according to one embodiment of the present invention. In FIG. 8a there is shown a partially prepared or manufactured TFT 600 which comprises a substrate 680, a bottom gate electrode 690, a dielectric layer 670, and a semiconducting layer 660.

There is also shown a donor substrate 600, which comprises a two-component transfer layer (A') with the first (thicker) layer comprising a conducting material (630), and the second (thin top) layer comprising a dopant (640). Also shown is a base substrate 610 and a light-to-heat conversion layer 620. The laser light 800 is also shown.

Transfer of this donor substrate 600 onto the surface of a semiconductor layer 660 will then result in deposits of metallic patterns 630D, 630S, with a thin layer of dopant 640 sandwiched between the metallic patterns 630D, 630S and the surface of the semiconductor layer 660. This approach allows introducing a doping profile 700 at the interface between the metallic patterns 630D, 630S and the semiconductor layer 660.

Also shown is a TFT substrate 680, a bottom gate electrode 690, a dielectric layer 670.

It should be clear to someone skilled in the art that a mask may need to be used with the donor substrate to mask the light applied during the LITI process to the donor substrate over the area that the bottom gate occupies. Therefore the LITI light mask and the bottom gate need to be carefully aligned such that the source, gate and dopant materials are deposited in the correct positions on the semiconductor material.

The light used by the LITI process is preferably infra-red, such that most light is absorbed by the source and drain electrode and not by the organic semiconductor layer. Frequencies of light in the red/orange range would also be appropriate. Further, due to the temperature sensitivity of the OSC a balance needs to be struck between using enough energy of light to sinter the (for example) silver colloid of the source and drain contacts whilst not effecting the OSC layer with excessive heat. A target temperature range would be less than 150-170° C., nearer to 100° C. preferably. Some silver colloids sinter at 120-130° which should therefore be suitable.

A summary of the process of the present invention which can be used to manufacture an organic TFT is as follows:
1. Gate deposition and patterning (e.g. patterning of an ITO-coated substrate) onto a glass or plastic substrate (for example).
2. Deposition of bottom electrodes and capacitors (if being used with an OLED for example—see FIGS. 9 and 10 following).
3. Dielectric deposition and patterning (e.g. cross-linkable inorganic/organic, photopatternable dielectrics).
4. Deposition of the OSC (e.g. by ink jet printing of a solution processable polymer).
5. Deposition of source, drain and dopant using LITI as described previously and in accordance with the present invention.

It should be clear to someone skilled in the art that the LITI process could be used to deposit the source and drain electrodes only (without a dopant material) and in such case the LITI process could be used for top gate TFTs. Further the LITI process as described could be used to deposit any one of the layers of a top gate or bottom gate organic TFT. However it has been found that the LITI process is most useful with bottom gate TFTs and where the deposition of the source, drain and dopant materials are done together in a single step.

The LITI process can therefore be used to deposit metal compounds such as ITO, zinc oxide, molybdenum oxide etc which otherwise cannot be done by prior art sputtering methods as they would damage the OSC.

Other features of organic TFTs in accordance with embodiments of the present invention are discussed below.

Substrate

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The organic semiconductive material may be made solution processable through the use of a suitable solvent. Exemplary solvents include alkylbenzenes such as toluene and xylene; tetralin; and chloroform. Preferred solution deposition techniques include spin coating and ink jet printing. Other solution deposition techniques include dip-coating, roll printing and screen printing.

Organic Semiconductor Materials

Preferred organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used. The thickness of the organic semiconductor layer is preferably 50-80 nm.

Source and Drain Electrodes

The conducting material component (source and drain electrodes) in the LITI transfer layer may be chosen to be an inorganic metal, a conducting metal oxide, or a conducting polymer. An example of such a conductive polymers is poly (ethylene dioxythiophene) (PEDOT) although other conductive polymers are known in the art.

Preferably, the conducting material possesses high electrical conductivity, and it could be chosen to comprise silver nano-particles that can be sintered at low temperatures in order to achieve high conductivity.

For a p-channel organic TFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as indium tin oxide may also be used. Further layers of molybdenum trioxide, or molybdenum oxide can also be applied.

The source and drain electrodes are preferably formed from the same material for ease of manufacture. However, it will be appreciated that the source and drain electrodes may be formed of different materials for optimization of charge injection and extraction respectively. In this case the transfer layer of the LITI donor substrate would need to be modified accordingly.

The length of the channel defined between the source and drain electrodes may be up to 500 microns, but preferably the length is less than 200 microns, more preferably less than 100 microns, most preferably less than 20 microns.

Gate Electrode

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above. Thicknesses of the gate electrode, source and drain electrodes may be in the region of 5-200 nm, although typically 50 nm as measured by Atomic Force Microscopy (AFM), for example.

Insulating Layer (Gate Dielectric)

The insulating layer comprises a dielectric material selected from insulating materials having a high resistivity. The dielectric constant, k, of the dielectric is typically around 2-3 although materials with a high value of k are desirable because the capacitance that is achievable for an organic TFT is directly proportional to k, and the drain current $I_D$ is directly proportional to the capacitance. Thus, in order to achieve high drain currents with low operational voltages, organic TFTs with thin dielectric layers in the channel region are preferred.

The dielectric material may be organic or inorganic. Preferred inorganic materials include SiO2, SiNx and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometres, more preferably less than 500 nm.

Dopant Materials

The dopant component in the LITI transfer layer may be chosen to be an acceptor compound with low-lying LUMO. Examples include Tetracyanoquinodimethane (TCNQ) and Tetrafluorotetracyanoquinodimethane (F4TCNQ).

The Applicants have shown in GB 2455096 that the combination of silver with F4TCNQ possesses excellent hole injection properties when used as Source and Drain contacts in organic TFTs. See, for example, Table IV which gives a value of 0.53 for $TCNQF_4$ and a value of only 0.17 for TCNQ relative to a saturated calomel electrode in acetonitrile. While $TCNQF_4$ has been found to be useful as a source/drain dopant in accordance with the present invention, other electron acceptors which may be suitable for use as dopants in accordance with embodiments of the present invention are also disclosed in Table IV, for example, $TCNQ(CN)_2$ and other halogenated derivates of TCNQ such as $TCNQCl_2$ and $TCNQBr_2$. Derivatives, such as fluorinated derivates, of other electron acceptors may also be used, for example, fluorinated derivatives of anthraquinone, perylenebisimide and tetracyanoanthraquinodimethane. Other electron withdrawing substituents for increasing electron affinity of a dopant include nitro ($-NO_2$) and cyano ($-CN$) groups.

Embodiments of GB 2455096 provide an improvement over the TCNQ dopants disclosed in US 2005/133782 in that the dopants have better selective binding to source/drain electrodes, better wettability of the OSC on the source/drain electrodes, and improved charge mobility of the OSC due to better doping.

Organic TFT Applications

Organic TFTs according to embodiments of the present invention have a wide range of possible applications. One such application is to drive pixels in an optical device, preferably an organic optical device. Examples of such optical devices include photoresponsive devices, in particular photodetectors, and light-emissive devices, in particular organic light emitting devices (OLEDs). Organic TFTs are particularly suited for use with active matrix organic light emitting devices, e.g. for use in display applications.

Figure 9:
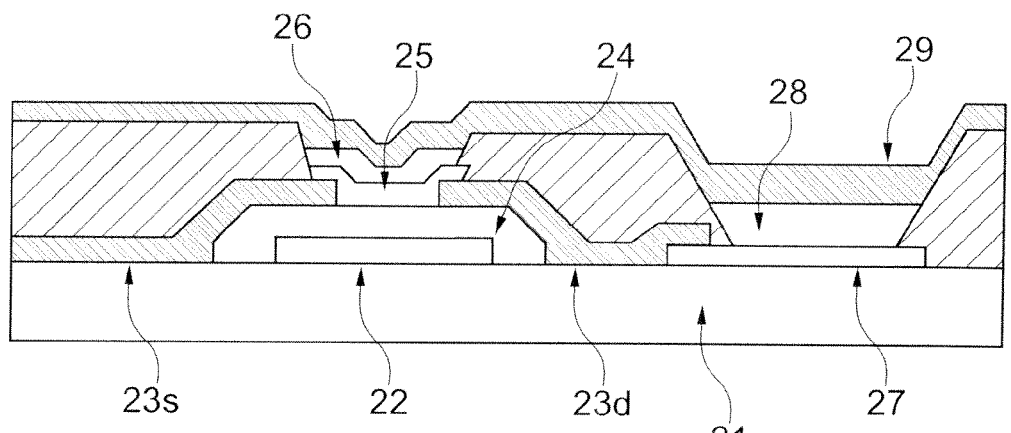
FIG. 9 illustrates a portion of an active matrix organic light emitting display comprising an organic thin film transistor and an organic light emitting device.

FIG. 9 shows a pixel comprising an organic thin film transistor and an adjacent organic light emitting device fabricated on a common substrate 21. The organic TFT comprises gate electrode 22, dielectric layer 24, source and drain electrodes 23s and 23d respectively, and OSC layer 25. The OLED comprises anode 27, cathode 29 and an electroluminescent layer 28 provided between the anode and cathode. Further layers may be located between the anode and cathode, such as charge transporting, charge injecting or charge blocking layers. In the embodiment of FIG. 9, the layer of cathode material extends across both the organic TFT and the OLED, and an insulating layer 26 is provided to electrically isolate the cathode layer 29 from the OSC layer 25. The active areas of the organic TFT and the OLED are defined by a common bank material formed by depositing a layer of photoresist on substrate 21 and patterning it to define organic TFT and OLED areas on the substrate. In this embodiment, the drain electrode 23d is directly connected to the anode of the organic light emitting device for switching the organic light emitting device between emitting and non-emitting states.

Figure 10:
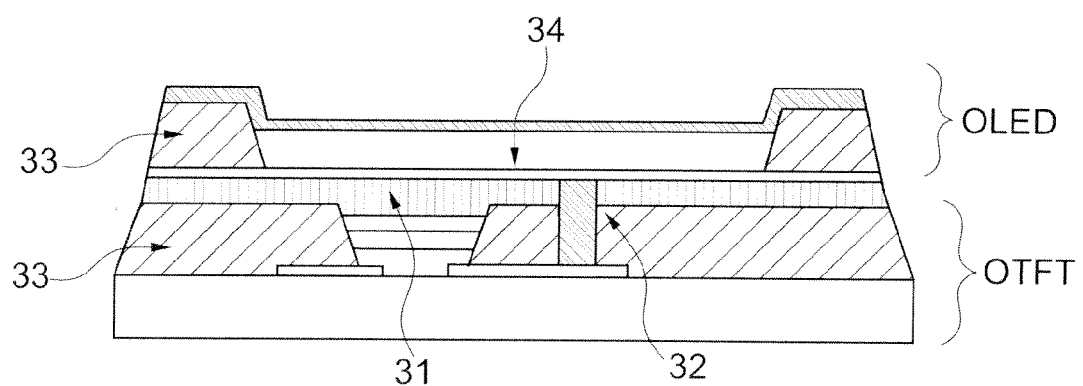
FIG. 10 illustrates a portion of another active matrix organic light emitting display arrangement comprising an organic thin film transistor and an organic light emitting device.

In an alternative arrangement illustrated in FIG. 10, an organic thin film transistor may be fabricated in a stacked relationship to an organic light emitting device. In such an embodiment, the organic thin film transistor is built up as described above in either a top or bottom gate configuration. As with the embodiment of FIG. 6, the active areas of the organic TFT and OLED are defined by a patterned layer of photoresist 33, however in this stacked arrangement, there are two separate bank layers 33—one for the OLED and one for the organic TFT. A planarisation layer 31 (also known as a passivation layer) is deposited over the organic TFT. Exemplary passivation layers include BCBs and parylenes. An organic light emitting device is fabricated over the passivation layer. The anode 34 of the organic light emitting device is electrically connected to the drain electrode of the organic thin film transistor by a conductive via 32 passing through passivation layer 31 and bank layer 33.

It will be appreciated that pixel circuits comprising an organic TFT and an optically active area (e.g. light emitting or light sensing area) may comprise further elements. In particular, the OLED pixel circuits of FIGS. 9 and 10 will typically comprise least one further transistor in addition to the driving transistor shown, and at least one capacitor.

It will be appreciated that the organic light emitting devices described herein may be top or bottom-emitting devices. That is, the devices may emit light through either the anode or cathode side of the device. In a transparent device, both the anode and cathode are transparent. It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum.

Transparent cathodes are particularly advantageous for active matrix devices because emission through a transparent anode in such devices may be at least partially blocked by organic TFT drive circuitry located underneath the emissive pixels as can be seen from the embodiment illustrated in FIG. 10.

While this invention has been particularly shown and described with reference to preferred embodiments thereof, it will be understood by those skilled in the art that various changes in form and details may be made therein without departing from the scope of the invention as defined by the appended claims.

The invention claimed is:

1. A method of manufacturing a bottom-gate organic thin film transistor (TFT), comprising:
   providing a substrate layer;
   providing a gate electrode on the substrate layer;
   providing a dielectric material layer over the gate electrode;
   providing an organic semiconductor (OSC) material layer over the dielectric material layer;
   depositing a source and/or drain electrode on the OSC layer using a laser induced thermal imaging (LITI) process: and
   providing a dopant material between the OSC material layer and the source and/or drain electrode layer using a laser induced thermal imaging (LITI) process.

2. A method of manufacturing an organic thin film transistor according to claim 1, wherein the dopant material comprises a dopant moiety for chemically doping an organic semi-conductive material by accepting electrons, wherein the dopant moiety has a redox potential of at least 0.3eV relative to a saturated calomel electrode (SCE) in acetonitrile.

3. A method of manufacturing an organic thin film transistor according to claim 2, wherein the redox potential of the dopant moiety is at least 0.4 eV relative to a saturated calomel electrode in acetonitrile.

4. A method of manufacturing an organic thin film transistor according to claim 3, wherein the redox potential of the dopant moiety is at least 0.5 eV relative to a saturated calomel electrode in acetonitrile.

5. A method of manufacturing an organic thin film transistor according to claim 2, wherein the dopant material comprises a dopant moiety which is a charge neutral dopant.

6. A method of manufacturing an organic thin film transistor according to claim 2, wherein the dopant moiety is substituted with a halogen, nitro, and / or CN group.

7. A method of manufacturing an organic thin film transistor according claim 6, wherein the dopant moiety is substituted with more than one halogen, nitro or CN groups.

8. A method of manufacturing an organic thin film transistor according claim 6, wherein the halogen is fluorine.

9. A method of manufacturing an organic thin film transistor according to claim 2, wherein the dopant moiety is a substituted tetracyanoquinodimethane, anthraquinone, perylenebisimide, or tetracyanoanthraquinodimethane.

10. A method of manufacturing an organic thin film transistor according to claim 2, wherein the organic semi-conductive material has a highest occupied molecular orbital (HOMO) level which is shallower than a lowest unoccupied molecular orbital (LUMO) of the dopant moiety.

11. A method of manufacturing an organic thin film transistor according to claim 2, wherein doped organic semi-conductive material adjacent the source and drain electrodes has a conductivity in the range $10^{-6}$ S/cm to $10^{-2}$ S/cm.

12. A method of manufacturing an organic thin film transistor according to claim 11, wherein the dielectric material comprises an organic dielectric material.

13. A method of manufacturing an organic thin film transistor according to claim 11, wherein the layer of dielectric material is treated to enhance selective binding of the dopant moiety to the source and drain electrodes.

14. A method of manufacturing an organic thin film transistor according to claim 1, wherein the organic semi-conductive material has a highest occupied molecular orbital (HOMO) level which is deeper than a lowest unoccupied molecular orbital (LUMO) level of tetracyanoquinodimethane (TCNQ).

15. A method according to claim 1, wherein the organic semi-conductive material is deposited from solution.

16. A method of manufacturing an organic thin film transistor according to claim 1, wherein the source and/or drain electrode material is selected from the group consisting of silver, silver colloid, tin, copper, gold, molybdenum, platinum, palladium, tungsten, chromium, and indium tin oxide.

17. A method of manufacturing an organic thin film transistor according to claim 16, wherein the transistor further comprises a layer of molybdenum trioxide or molybdenum oxide.

18. A method of manufacturing an organic thin film transistor according to claim 1, wherein the source and/or drain electrode deposited using LITI is heat treated at a temperature of less than 150° C.

19. A method of manufacturing an organic thin film transistor according to claim 18, wherein the source and/or drain electrode deposited using LITI is heat treated at a temperature in the range 120° C. to 130° C.

20. A method of manufacturing an organic thin film transistor according to claim 18, wherein the source and/or drain electrode deposited using LITI is sintered.

21. A method of manufacturing an organic thin film transistor according to claim 1, further comprising using light in the infra-red to orange range.

22. An organic thin film transistor (TFT) manufactured according to claim 1.

23. A method of manufacturing an organic thin film transistor (TFT), comprising:
    providing a substrate layer;
    providing a gate electrode layer;
    providing a dielectric material layer;
    providing an organic semiconductor (OSC) material layer; and
    providing a source and drain electrode layer;
    providing a dopant material between the OSC material layer and the source and drain electrode layer using a laser induced thermal imaging (LITI) process;
    wherein one or more of the layers is deposited using a laser induced thermal imaging (LITI) process.

24. A method of manufacturing a top-gate organic thin film transistor (TFT), comprising:
    providing a substrate layer;
    depositing a source and/or drain electrode on the substrate layer using a laser induced thermal imaging (LITI) process;
    providing an organic semiconductor (OSC) material layer over the source and drain electrode;
    providing a dielectric material layer over the (OSC) material layer;
    providing a gate electrode on the dielectric material layer: and
    providing a dopant material between the OSC material layer and the source and drain electrode layer using a laser induced thermal imaging (LITI) process.

25. A method of manufacturing a bottom-gate organic thin film transistor (TFT), comprising:
    providing a substrate layer;
    providing a gate electrode on the substrate layer;
    providing a dielectric material layer over the gate electrode;
    depositing a source and/or drain electrode over the dielectric material layer using a laser induced thermal imaging (LITI) process;
    providing an organic semiconductor (OSC) material layer over the source and drain layer; and
    providing a dopant material between the OSC material layer and the source and drain electrode layer using a laser induced thermal imaging (LITI) process.

26. An Organic Light Emitting Diode (OLED) device, wherein the OLED device includes an organic TFT manufactured according to any one of the preceding claims.

* * * * *